United States Patent
Huang

[11] Patent Number: 6,160,447
[45] Date of Patent: Dec. 12, 2000

[54] AMPLIFIER HAVING REDUNDANCIES

[75] Inventor: Guanghua River Huang, Prior Lake, Minn.

[73] Assignee: ADC Solitra, Inc., Hutchinson, Minn.

[21] Appl. No.: 09/247,416

[22] Filed: Feb. 10, 1999

[51] Int. Cl.⁷ .................................. H03F 3/68; H03F 1/14
[52] U.S. Cl. ......................... 330/124 D; 330/51; 330/295
[58] Field of Search ................................ 330/51, 124 D, 330/124 R, 295

[56] References Cited

U.S. PATENT DOCUMENTS

| | | | |
|---|---|---|---|
| 4,198,611 | 4/1980 | Eng | 330/124 D |
| 4,965,530 | 10/1990 | Katz | 330/295 |
| 5,418,490 | 5/1995 | Kaegebein | 330/51 |

Primary Examiner—Benny Lee
Assistant Examiner—Patricia T. Nguyen
Attorney, Agent, or Firm—Merchant & Gould P.C.

[57] ABSTRACT

A redundant balanced amplifying apparatus. The apparatus comprises a signal path. A portion of the signal path is split into a first and second sets of signal branches. The first and second sets of signal branches are parallel. A plurality of amplifiers are arranged so that each signal branch within the first and second sets of signal branches flows through at least one amplifier. A first set of switches are arranged to selectively shunt signal branches within the first set of signal branches. The first set of switches have at least one switch. A second set of switches are arranged to selectively shunt signal branches within the second set of signal branches. The second set of switches have at least one switch.

3 Claims, 3 Drawing Sheets

AMPLIFIER HAVING REDUNDANCIES

TECHNICAL FIELD

The present invention relates to amplifiers, and more particularly to an amplifier having redundancies.

BACKGROUND

Communication systems commonly have antennas mounted on top of towers. The antennas send radio signals to, and receive radio signals from, remote communication equipment such as radios, mobile telephones, and the like. In a cellular telephone application, for example, radio waves from the cellular telephone are received by an antenna mounted on top of a tower, or similar structure, which converts the waves to an electrical signal. A transmission line or cable then carries the electrical signal to a base station for processing. The base station is typically positioned at the base of the tower and includes radio equipment such as a receiver for receiving a radio signal from the cellular telephone and a transmitter for transmitting a radio signal to the telephone, thereby establishing two-way communication. The radio signals are processed and communicated to either another cellular telephone or a traditional land-line telephone so that the people can speak to one another.

One problem with these systems is that the radio wave from the cellular telephone that is received at the base-station antenna, and hence the resulting electrical signal, is relatively weak. The electrical signal received needs to be amplified so that it can be carried along the transmission line from the top of the tower to base-station equipment for processing. Accordingly, some installations place an amplifier at the top of the tower to amplify the electrical signal before it is communicated down the transmission line. In one possible application this amplifier is a low-noise amplifier to reduce the ratio of noise to signal amplitude, which increases sensitivity of a system.

These amplifiers are prone to failure for several reasons. For example, they are exposed to extreme weather conditions including freezing cold and high heat. Furthermore, amplifiers that handle high power or have a high gain produce heat that can degrade the semiconductor material from which they are made. This degradation in the material also causes failure. The difficulty is that a failed amplifier can cause the transmission tower to become inoperative and result in an entire geographic area losing cellular telephone service. Given the reliance on cell phones for business and emergency workers, this loss could be catastrophic.

Furthermore, climbing a tower can be dangerous, especially during winter when it is cold and icy. This danger is especially true for some towers that can exceed a height of 400 feet. As a result, technicians need to avoid climbing towers except to perform scheduled maintenance, which is preferably scheduled during good weather and temperate times of the year.

One approach to minimize the impact of an amplifier that fails is to provide redundant amplifiers. In this approach, switches are positioned upstream and downstream from the amplifiers. The switches then control to which amplifier the electrical signal is input. A shortcoming with this approach is that the electrical signal that is carried to the base station for processing must flow through the switches, which introduce noise into the signal and cause insertion loss that decreases the strength of the signal and counters the effect of the amplifier.

Additionally, one possible configuration has balanced amplifiers in which the signal is split so that a first portion of the electrical signal passes down one signal branch through a first amplifier and a second portion of the electrical signal passes down a second signal branch and through a second amplifier. The signals are then recombined and carried by the transmission line to the base station. In this manner, the pair of amplifiers cooperate to condition the signal received from the cellular phone. If a redundant amplifier is used, the switches switch between pairs of amplifiers, which also has shortcomings. For example, if one amplifier in the main pair fails, the switches will direct the radio signal to the redundant pair of amplifiers. The good amplifier in the first pair then sits idle and cannot be used until its mating amplifier is repaired. This configuration limits the number of potential combinations between amplifiers and thus limits how much the failure rate can be reduced through the use of redundant amplifiers.

Accordingly, there is a need in the art for an amplifier that has a reduced risk of failure. There is a related need for an amplifier that has increased redundancy. Accordingly, there is a related need for a balanced amplifier configuration that maximizes the number of possible combinations between amplifiers. There is yet another need for a redundant amplifier in which the electrical signal being processed does not flow through a switch. There is a related need for a redundant amplifier that has improved noise and sensitivity characteristics.

SUMMARY

One embodiment of the invention is directed to a redundant amplifying apparatus. The apparatus comprises a signal path. A portion of the signal path is split into at least two parallel signal branches. A plurality of amplifiers are arranged so that each signal branch flows through at least one amplifier. At least one switch is arranged to selectively shunt the signal branches.

A related embodiment of the present invention is directed to a method of controlling redundant amplifier. The method comprises the steps of: directing an electrical signal down a plurality of parallel signal branches; and shunting all but one of the parallel signal branches.

Another embodiment of the present invention is directed to a redundant balanced amplifying apparatus. The apparatus comprises a signal path. A portion of the signal path is split into a first and second sets of signal branches. The first and second sets of signal branches are parallel. A plurality of amplifiers are arranged so that each signal branch within the first and second sets of signal branches flows through at least one amplifier. A first set of switches are arranged to selectively shunt signal branches within the first set of signal branches. The first set of switches has at least one switch. A second set of switches are arranged to selectively shunt signal branches within the second set of signal branches. The second set of switches has at least one switch.

A related embodiment of the present invention is directed to a method of controlling redundant amplifier. The method comprising the steps of: directing an electrical signal down a first set of signal branches; shunting all but one of the signal branches within the first set of signal branches; directing an electrical signal down a second set of signal branches; and shunting all but one of the signal branches within the second set of signal branches.

DETAILED DESCRIPTION

Figure 1:
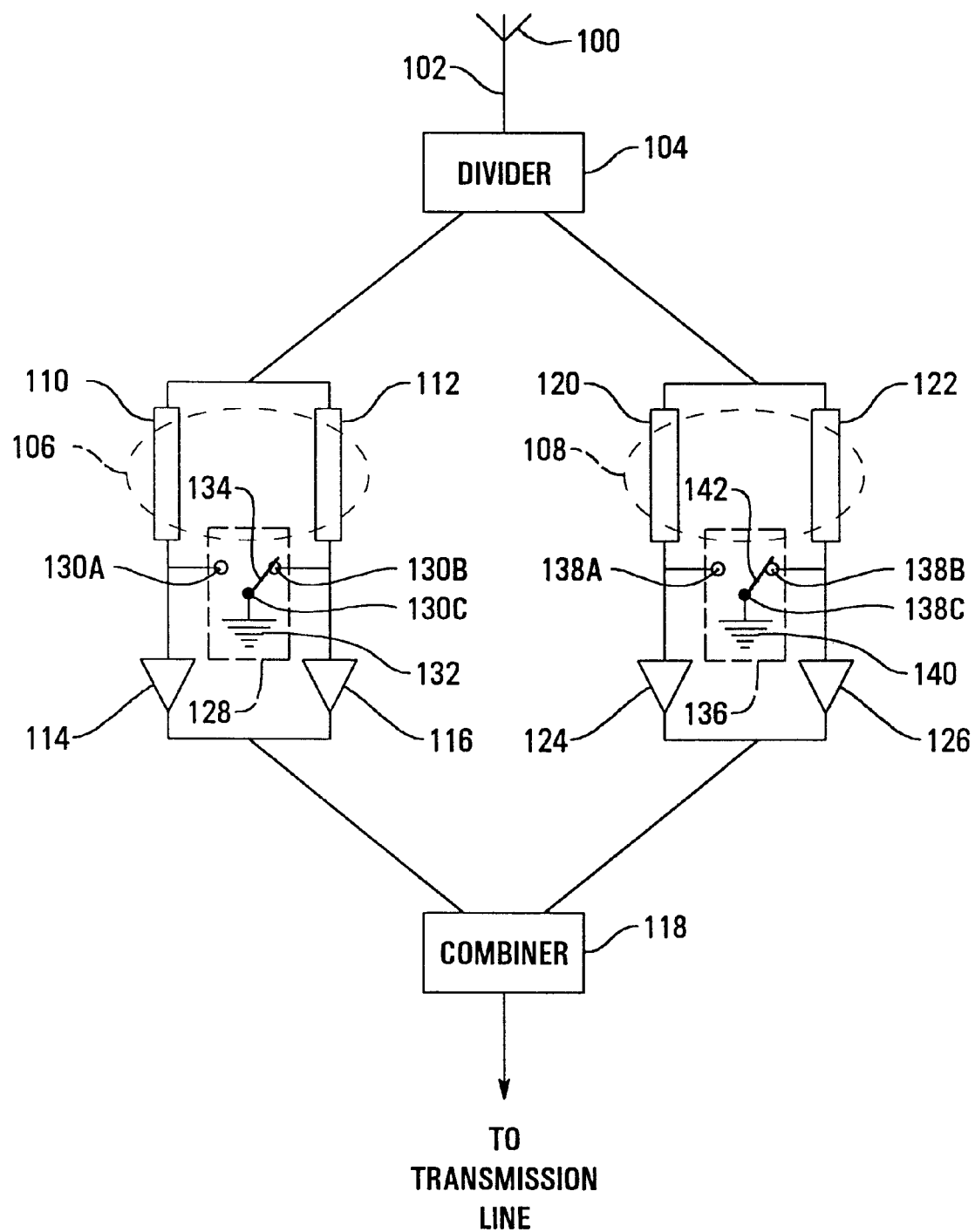
FIG. 1 is a block diagram of an amplifier embodying the present invention.

Various embodiments of the present invention, including a preferred embodiment, will be described in detail with reference to the drawings wherein like reference numerals represent like parts and assemblies throughout the several views. Reference to the described embodiments does not limit the scope of the invention, which is limited only by the scope of the appended claims.

In general terms, the present invention relates to a redundant amplifier configuration in which the mechanism for switching between the redundant amplifiers is not directly in the path of the signal being processed. In this configuration, the switching mechanism does not cause noise in the signal or contribute to insertion loss. The present invention also generally relates to a balanced amplifier that can switch between amplifiers within a signal branch rather than having to switch between sets of balanced signal branches themselves. Having at least one redundant amplifier within each signal branch reduces the failure rate of the balanced amplifier by at least half.

Referring now to FIG. 1, an antenna 100 is mounted in an appropriate location such as the on a tower or similar structure. The antenna 100 receives radio waves and converts them to an electrical signal that is transmitted along a signal path 102. The signal path 102 is electrically coupled to the input of a divider 104 that splits the electrical signal into first and second sets of signal branches 106 and 108. In one possible embodiment, the divider 104 splits the electrical signal so that one set of frequencies are transmitted to the first set of signal branches 106, and another set of frequencies are transmitted to the second set of signal branches 108.

The first set of signal branches 106 has first and second transmission lines 110 and 112 configured and arranged to carry the same electrical signal from the divider 104. The first transmission line 110 is input into a first low-noise amplifier 114, and the second transmission line 112 is input into a second low-noise amplifier 116. The outputs of the first and second low-noise amplifiers 114 and 116 are then input into a combiner 118.

Similarly, the second set of signal branches 108 has third and fourth transmission lines 120 and 122 configured and arranged to carry the same electrical signal from the divider 104. The third transmission line 120 is input into a third low-noise amplifier 124, and the fourth transmission 122 line is input into a fourth low-noise amplifier 126. The outputs of the third and fourth low-noise amplifiers 124 and 126 are then input into the combiner 118. The combiner 118 rejoins the signals being transmitted through the first and second sets of signal branches 106 and 108.

In one embodiment, the first, second, third, and fourth transmission lines 110, 112, 120, and 122, are approximately the same length. In another possible embodiment, the first, second, third, and fourth transmission lines 110, 112, 120, and 122 have quarter wave length characteristics.

The low-noise amplifiers 114, 116, 124, and 126 are transistor amplifiers, although other types of amplifiers can be used. Additionally, the impedance for the input of each of the amplifiers 114, 116, 124, and 126 is matched to the output of divider 104. Other electrical components can have matched impedance inputs and outputs as well to improve system performance.

Additionally, the signal transmitted from the divider 104 to the second set of signal branches 108 passes through a phase shifter (not shown), such as quarter-wave microstrip circuit, that shifts the signal's phase by 90°. Similarly, the signal output from the first set of signal branches 106, and hence the low-noise amplifiers 114 and 116, is passed through a phase shifter that shifts the signal by 90°. The signals input to the combiner 118 from the first and second sets of signal branches 106 and 108 are then in phase relative to one another.

A first switch 128 is electrically connected to the first and second signal branches within the first set of signal branches 106. The first switch 128 has fixed contacts 130a–130c electrically connected to ground 132, the input to the first low-noise amplifier 114, and the input to the second low-noise amplifier 116, respectively. The first switch 128 has a movable contact 134 with first pole electrically connected to the fixed contact 130c and in electrical communication with ground 132. The movable contact 134 has a second pole that can be selectively switched between the fixed contacts 130a and 130b and hence between inputs to the first and second low-noise amplifiers 114 and 116. In this configuration, the input to the second low-noise amplifier 116 is grounded. The path for the electrical signal flowing through the first set of signal branches 106 is then through the first signal branch and the first low-noise amplifier 114. However, the first switch 128 can be selectively switched to ground the input to the first low-noise amplifier 114 and establish the path for the electrical signal through the second signal branch and the second low-noise amplifier 116.

A second switch 136 is similarly connected to the third and fourth signal branches within the second set of signal branches 108. The second switch 136 has fixed contacts 138a–138c electrically connected to ground 140, the input to the third low-noise amplifier 124, and the input to the fourth low-noise amplifier 126, respectively. The second switch 136 has a movable contact 142 with first pole electrically connected to the fixed contact 138c and in electrical communication with ground 140. The movable contact 142 has a second pole that can be selectively switched between the fixed contacts 138a and 138b and hence between inputs to the third and fourth low-noise amplifiers 124 and 126. In this configuration, the input to the fourth low-noise amplifier 126 is grounded. The path for the electrical signal flowing through the second set of signal branches 108 is then through the third signal branch and the third low-noise amplifier 124. However, the second switch 136 can be selectively switched to ground the input to the third low-noise amplifier 124 and establish the path for the electrical signal path through the fourth signal branch and the fourth low-noise amplifier 126.

In this configuration, the low-noise amplifier within each set of signal branches 106 and 108 that is not shunted to ground is the active low-noise amplifier, while the remaining low-noise amplifiers within a set of signal branches are backup or redundant low-noise amplifiers. Furthermore, while the switches 128 and 136 are shown shunting the electrical signal traveling along the redundant signal branch to ground, other possible embodiments might shunt the electrical signal to other electrical components or other signal paths so long as the electrical signal is diverted off of the signal branch before it would be otherwise combined with the signal from the active signal branch.

In use, a radio wave is received at the antenna 100 and converted to an electrical signal. The electrical signal flows along the signal path 102 where it passes through the divider 104, which splits the signal between the first and second sets of signal branches 106 and 108. The signal communicated to the first set of signal branches 106 is simultaneously communicated along both the first and second transmission lines 110 and 112. The electrical signal being transmitted along the first transmission line 110 is then passed through the first low-noise amplifier 114 and to the combiner 118. The electrical signal being transmitted along the second transmission line 112 is then shunted to ground 132 through the first switch 128.

Similarly, the signal communicated to the second set of signal branches 108 is simultaneously communicated along both the third and fourth transmission lines 120 and 122. The electrical signal being transmitted along the third transmission line 120 is then passed through the third low-noise amplifier 124 and to the combiner 118. The electrical signal being transmitted along the fourth transmission line 122 is then shunted to ground 140 through the second switch 136. The combiner 118 then rejoins and outputs the electrical signals that were split by the divider 104. The signal then continues to flow along the signal path 102 to the base station or through other conditioning equipment.

If one of the low-noise amplifiers fails, the switch to which that low-noise amplifier is in electrical communication switches, causing the redundant low-noise amplifier to become active. For example, if the first low-noise amplifier 114 fails, the first switch 128 will switch and cause the first signal branch to be shunted to ground 132 and the second signal branch will then pass the electrical signal through the second low-noise amplifier 116 and to the combiner 118 where it will be rejoined with the electrical signal from the second set of signal branches 108. Similarly, if the third low-noise amplifier 124 fails, the second switch 136 will switch and cause the third signal branch to be shunted to ground 140 and the fourth signal path will then pass the electrical signal through the fourth low-noise amplifier 126 and to the combiner 118 where it will be rejoined with the electrical signal from the first set of signal branches 106.

In order to determine whether an amplifier has failed, each signal branch and each switch is electrically connected to a switch controller, which monitors the signal branches and controls the switches. In one possible embodiment, the switch controller is similar to that disclosed in the U.S. patent application Ser. No. 08/762,519, entitled Amplifier Switch Controller and System and filed on Dec. 9, 1996, the disclosure of which is hereby incorporated by reference.

This embodiment has several advantages. One advantage is that the probability of the entire amplifying apparatus failing is reduced. For example, the failure rate of this embodiment is $(2 \cdot N)/4 \rightarrow 0.5N$, where N is the failure rate of a single low-noise amplifier. This failure rate is a significant improvement over the prior art as described above. Other embodiments, might include more than two signal branches within a set of signal branches, which would reduce the risk of system failure even more. For example, having four signal branches in each set of signal branches would reduce the failure rate to $(2 \cdot N)/8 \rightarrow 0.25N$. Given the reduced failure rate of the embodiment described above, the probability that an amplifier apparatus will require repair outside of its normal preventative maintenance schedule is reduced, which results in greater safety. In cellular telephone applications, it is less likely that a technician will have to make extra trips up a radio tower when weather conditions are cold, windy, icy, or otherwise dangerous.

Another advantage is that the switches used to activate the redundant signal branches is not inline with the signal path. That is, the electrical signal being processed does not have to pass through the switch. As a result, the switches do not add noise or insertion loss, which might counteract the low-noise amplifier.

Figure 2:
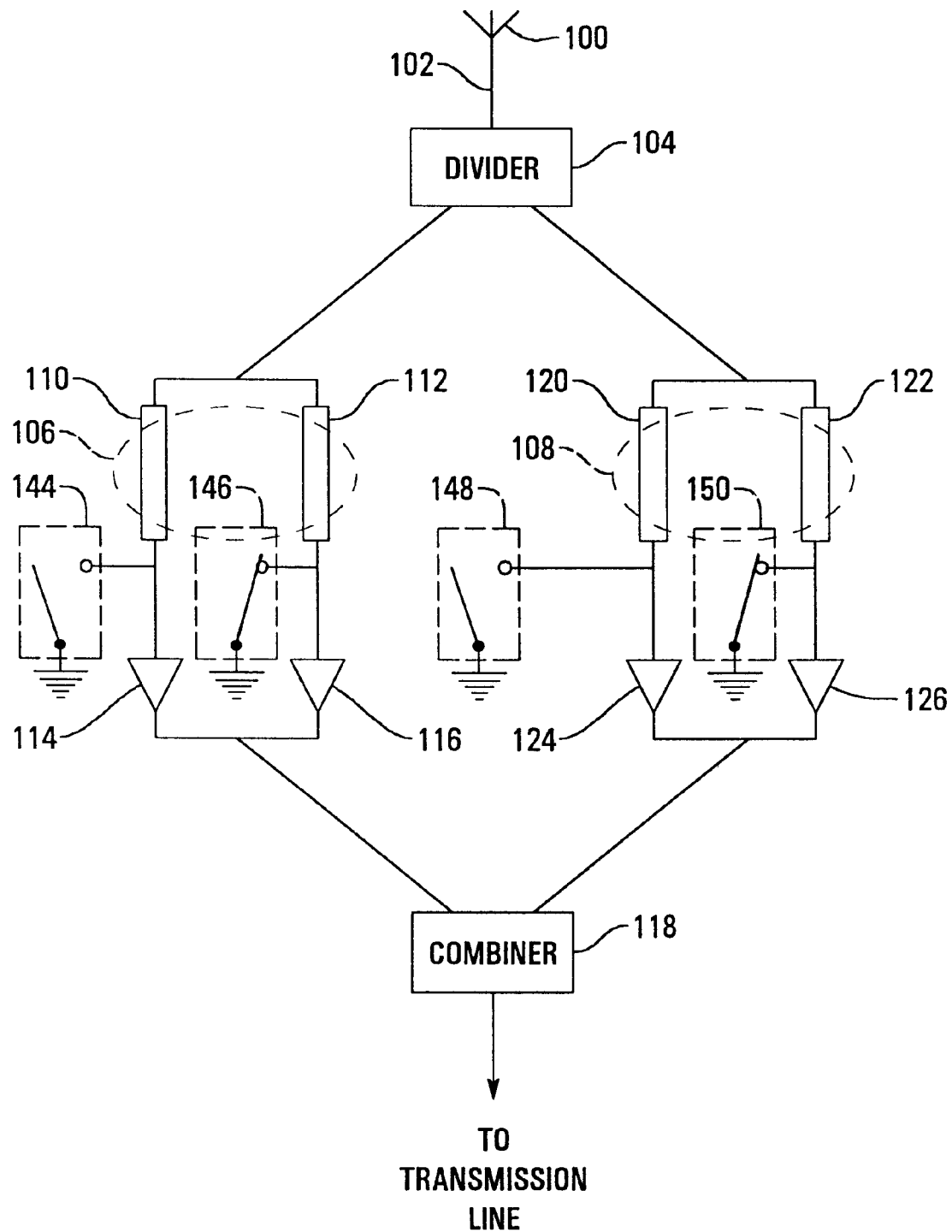
FIG. 2 is a block diagram of another alternative embodiment of the amplifier shown in FIG. 1.

There are many possible embodiments to the arrangement shown in FIG. 1. The embodiment shown in FIG. 2, for example, includes an antenna 100, signal path 102 having sets of signal branches 106 and 108, low-noise amplifiers 114, 116, 124, and 126, and a combiner 1 18. Additionally, there are first, second, third, and fourth switches 144, 146, 148, and 150 that are in electrical communication with the first, second, third, and fourth signal branches, respectively. This embodiment work in a manner similar to that of FIG. 1 as described above.

Figure 3:
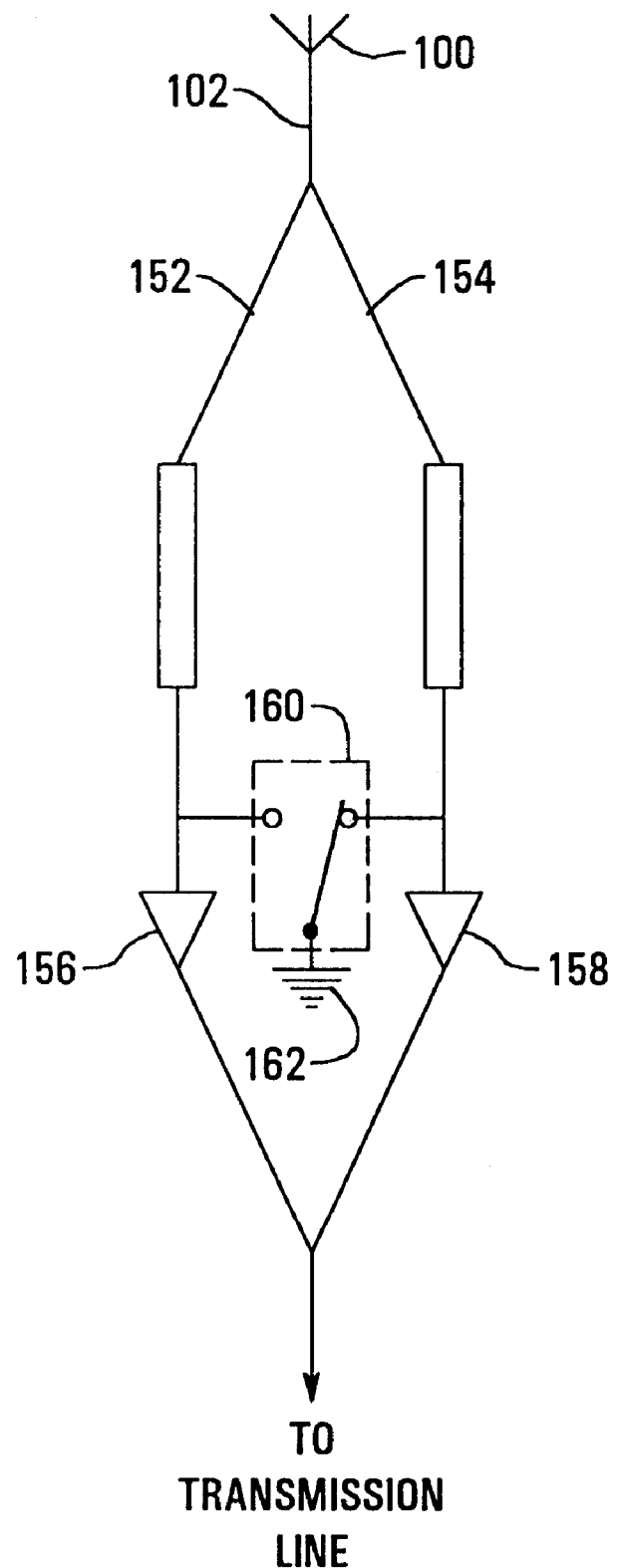
FIG. 3 is a block diagram of another alternative embodiment of the amplifier shown in FIG. 1.

In another possible embodiment, as shown in FIG. 3, the configuration of switches can be used to switch between active and redundant amplifiers that are not balanced. In this embodiment, the signal path 102 from the antenna 100 is split into an active and a redundant signal branch 152 and 154. The active and redundant signal branches 152 and 154 then flow through active and redundant amplifiers 156 and 158, respectively. A switch 160 is electrically connected between the active signal branch 152, the redundant signal branch 154, and ground 162. The switch 160 toggles between the signal branches 152 and 154 if the active amplifier 156 fails. Additionally, this embodiment can include more than two signal branches. For example, there could be one active signal branch and two or more redundant signal paths to provide additional backup. An advantage of this embodiment is that the switch 160 is not directly in-line with the signal path and thus does not introduce insertion loss or noise into the amplifier apparatus.

Furthermore, the switches as described above are mechanical switches. Other embodiments might include solid-state switches or other appropriate type of mechanical switch. Similarly, the device can use any number of appropriate types of amplifiers including those formed with discrete electronic components or those formed with semiconductor devices such as op amps. Additionally, the embodiments described herein can be used with amplifiers other than low-noise amplifiers.

While specific embodiments have been described herein, it is evident that other alternatives, modifications, and variations can be made in view of the foregoing description. For example, features of one of the embodiments described above can be combined with features of any of the other embodiments. Alternatively, there can be modifications that are not explicitly taught herein, but still embody the spirit of invention claimed below. Accordingly, the invention is not limited to these embodiments or the use of elements having specific configurations and shapes as presented herein.

The claimed invention is:

1. A redundant balanced amplifying apparatus comprising:
   a signal path, a portion of the signal path being split into first and second sets of signal branches, the first and second set of signal branches being parallel, wherein the first set of signal branches includes first and second signal branches and the second set of signal branches includes third and fourth signal branches;
   a plurality of amplifiers arranged so that each signal branch within the first and second sets of signal branches flows through at least one amplifier;
   a first set of switches arranged to selectively shunt signal branches within the first set of signal branches, the first set of switches having at least one switch, wherein the first set of switches includes one switch having a first pole selectively switchable between the first and second signal branches and a second pole electrically connected to ground;

a second set of switches arranged to selectively shunt signal branches within the second set of signal branches, the second set of switches having at least one switch, wherein the second set of switches includes one switch having a first pole selectively switchable between the third and fourth signal branches and a second pole electrically connected to ground;

a divider arranged to split an electrical signal traveling along the signal path between the first set of signal branches and the second set of signal branches; and a combiner arranged to rejoin electrical signals traveling along the first set of signal branches and the second set of signal branches.

2. The redundant amplifying apparatus of claim 1 wherein:

the first pole of the first switch is electrically connected to the first and second signal branches upstream from the amplifiers; and the first pole of the second switch is electrically connected to the third and fourth signal branches upstream from the amplifiers.

3. The redundant amplifying apparatus of claim 1 wherein:

the first pole of the switch is electrically connected to the first and second signal branches downstream from the amplifiers; and the first pole of the second switch is electrically connected to the third and fourth signal branches downstream from the amplifiers.

* * * * *